(12) United States Patent
Gothait et al.

(10) Patent No.: US 8,343,869 B2
(45) Date of Patent: Jan. 1, 2013

(54) METHOD FOR NON-CONTACT MATERIALS DEPOSITION

(75) Inventors: Hanan Gothait, Rehovot (IL); Michael Dovrat, Modi'in (IL); Ofir Baharav, Shanghai (CN); Axel Benichou, Tel-Aviv (IL)

(73) Assignee: Xjet Ltd., Rehovot (IL)

(*) Notice: Subject to any disclaimer, the term of this patent is extended or adjusted under 35 U.S.C. 154(b) by 126 days.

(21) Appl. No.: 13/001,273

(22) PCT Filed: Jun. 24, 2009

(86) PCT No.: PCT/IL2009/000628
§ 371 (c)(1),
(2), (4) Date: Mar. 1, 2011

(87) PCT Pub. No.: WO2009/156993
PCT Pub. Date: Dec. 30, 2009

(65) Prior Publication Data
US 2011/0151665 A1 Jun. 23, 2011

Related U.S. Application Data

(60) Provisional application No. 61/075,147, filed on Jun. 24, 2008, provisional application No. 61/118,653, filed on Nov. 30, 2008.

(51) Int. Cl.
*H01L 21/44* (2006.01)
*H01L 21/20* (2006.01)

(52) U.S. Cl. ......... 438/674; 438/584
(58) Field of Classification Search .......... None
See application file for complete search history.

(56) References Cited

U.S. PATENT DOCUMENTS

| | | | |
|---|---|---|---|
| 2001/0035129 A1* | 11/2001 | Chandra et al. | 118/722 |
| 2004/0145629 A1 | 7/2004 | Silverbrook | |
| 2005/0037614 A1 | 2/2005 | Fukuchi | |
| 2006/0045962 A1 | 3/2006 | Miura | |
| 2007/0030326 A1 | 2/2007 | Silverbrook | |
| 2008/0158278 A1 | 7/2008 | Inoue | |

FOREIGN PATENT DOCUMENTS

| | | |
|---|---|---|
| EP | 1 737 284 | 12/2006 |
| JP | 2003/318133 | 11/2003 |
| JP | 2008/073647 | 4/2008 |

OTHER PUBLICATIONS

International Search Report and written opinion for International Application No. PCT/IL2009/000628 Date of Mailing Feb. 16, 2010.

* cited by examiner

*Primary Examiner* — Scott B Geyer
(74) *Attorney, Agent, or Firm* — Pearl Cohen Zedek Latzer, LLP

(57) ABSTRACT

Embodiments of the invention are directed to a method of printing lines. The method may include depositing material on a substrate from a plurality of nozzles to form a multi-layered line of a desired cross section area or a desired height by dispensing the material in at least two layers in a single scan. Each layer may be printed by different nozzles and the number of layers in the line is determined based on the desired cross section area or height.

12 Claims, 4 Drawing Sheets

METHOD FOR NON-CONTACT MATERIALS DEPOSITION

CROSS-REFERENCE TO RELATED APPLICATIONS

This application is a National Phase Application of PCT International Application No. PCT/IL2009/000628, International Filing Date Jun. 24, 2009, claiming priority of US Provisional Patent Application, 61/075,147, filed Jun. 24, 2008 and US Provisional Patent Application, 61/118,653, filed Nov. 30, 2008, all of which are incorporated herein in their entirety.

BACKGROUND OF THE INVENTION

Introducing non-contact deposition technologies, such as inkjet printing or aerosol dispensing in the manufacturing of solar cells, flat panel displays, thin film transistors (TFT) or printed circuits may enable producing thin conductive contacts having a width of 10 µm or less. However, decreasing the width of the conducting lines may result in reduced electrical conductivity. In order to maintain a desired conductivity, the cross section area of the line should remain constant and accordingly downsizing the width dimension should be compensated by enlarging the height dimension resulting in a higher aspect ratio of the conductive lines. It is a technological challenge to manufacture in mass production high-quality narrow metallization lines with a high aspect ratio.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
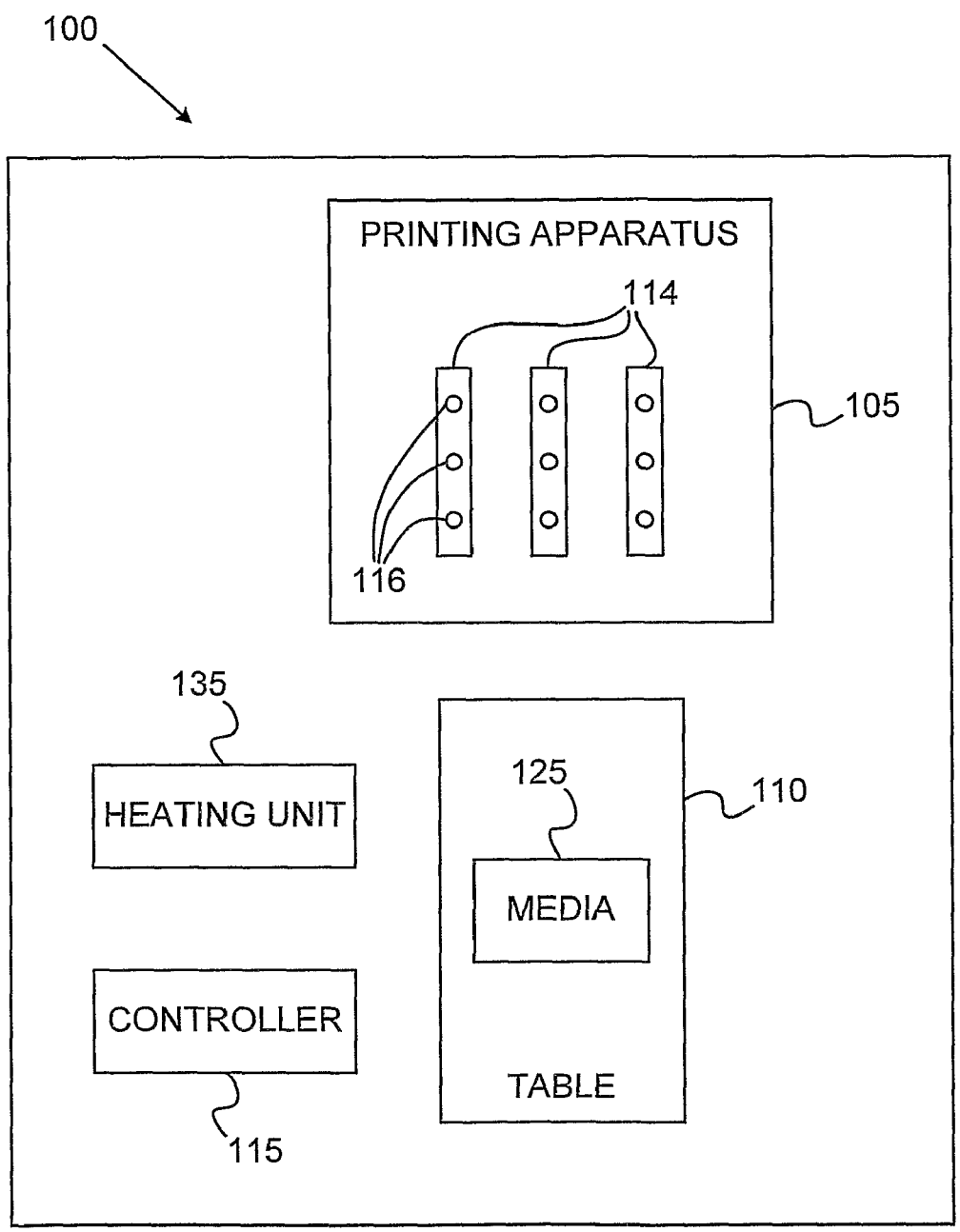
FIG. 1 shows an illustration of an exemplary printing system according to embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE INVENTION

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Embodiments of the invention may be applicable to a variety of printing systems and methods. For the sake of clarity and simplicity exemplary embodiments and references of non-contact material deposition systems will mostly be for the application of fabrication of conducting metal lines for microelectronics, flat panel displays and solar cells using an inkjet system. However, the scope of the invention is not limited by such exemplary embodiments and may be applied to other deposition systems, such an aerosol jet deposition system or a dispenser and to other applications, such as graphics, press, mass media, packaging, electronics and others using any suitable inks or dispensing materials.

Embodiments of the invention are directed to method of printing lines, for example electrically conductive lines by non-contact deposition methods. For example, the method may include depositing material, such as silver on a substrate such as a semiconductor wafer from a plurality of inkjet nozzles to print electrically conductive contact lines. The line may be designed to have a desired cross section area that would satisfy the conductivity requirements. The cross section area is within a plane perpendicular to a length dimension of the line. For some applications, such as for example metallization patterns for front sides of photovoltaic cells, it may be advantageous to reduce the width of the contact line as possible and to compensate for the reduced conductivity by enlarging the height of the line instead, providing a higher aspect ratio. According to some embodiments, a multi-layered line of a desired cross section area and/or a desired height may be printed by dispensing the material in at least two layers. The layers may be printed in a single scan, wherein each layer is printed by a corresponding group of one or more nozzles, and the number of layers in the line is determined based on the desired height or cross section area. While in some embodiments, nozzles in a row or group may be associated with a single printing head other configurations may be possible as detailed herein.

According to embodiments of the invention, the groups of nozzles may be arranged in the scan direction. The scan direction designated as the X direction refers to the direction of relative movement between the printing unit (printing head) and the print media (substrate) during the printing process when material is selectively dispensed from nozzles of the printing unit onto the print media. The relative movement may be achieved by moving the printing head while a tray carrying the print media is kept motionless or by moving a conveyor carrying the print media while printing from a stationary printing head or by moving both the printing head and the print media. For ease of explanation the description below illustrates a system and method where the printing head is stationary and the print media moves in the scan direction on a conveyor, but it should be understood to a person skilled in the art that embodiments of the invention are likewise applicable to other forms of relative movements between the printing head and the print media.

Reference is now made to FIG. 1 showing is a high level illustration of an inkjet printing system according to embodiments of the invention. The exemplary system, denoted system 100, may utilize material deposition printing techniques, such as inkjet printing or aerosol deposition. Printing system 100 may include and a printing apparatus 105 and a printing table or platform 110. Printing platform 110 may include a horizontal surface to carry substrates, such as for example semiconductor wafers. Printing apparatus 105 may include, for example, ink jet printing units or printing heads 114 having a plurality of dispensing nozzles 116 arranged in one or more rows. The printing head may be located with respect to printing table 110 such that the rows are parallel to the scan direction X. Printing table 110 may include a conveyor that may move a substrate or media 125 along the scan direction while printing apparatus 105 remains stationary. According to other embodiments, printing apparatus 105 may move in the scan direction, in the cross scan direction (Y) or in both X and Y directions.

System 100 may further include a controller 115, such as microprocessor to control the printing process. For example, controller 115 may cause nozzles in print unit 105 to deposit material on media 125 according to information in a print file stored in the controller such that one or more lines of a desired height are formed in a single scan. Controller 115 may include storage medium having stored thereon instructions for the printing process.

According to embodiments of the invention, system 100 may comprise a heating unit 135 to heat the printed media. For example, heating unit 135 may be installed or within printing table 110 to enable heating the printed media from underneath so as to solidify printed layers. Controller 115 may control heating unit 135.

Figure 2A:
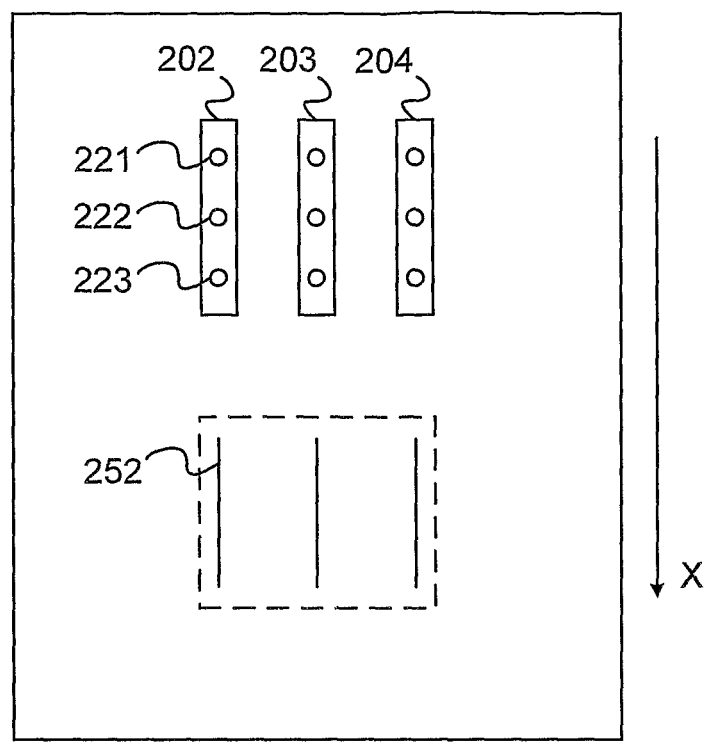
FIGS. 2A and 2B are illustrations of exemplary printing arrangements according to embodiments of the invention.
Figure 2B:
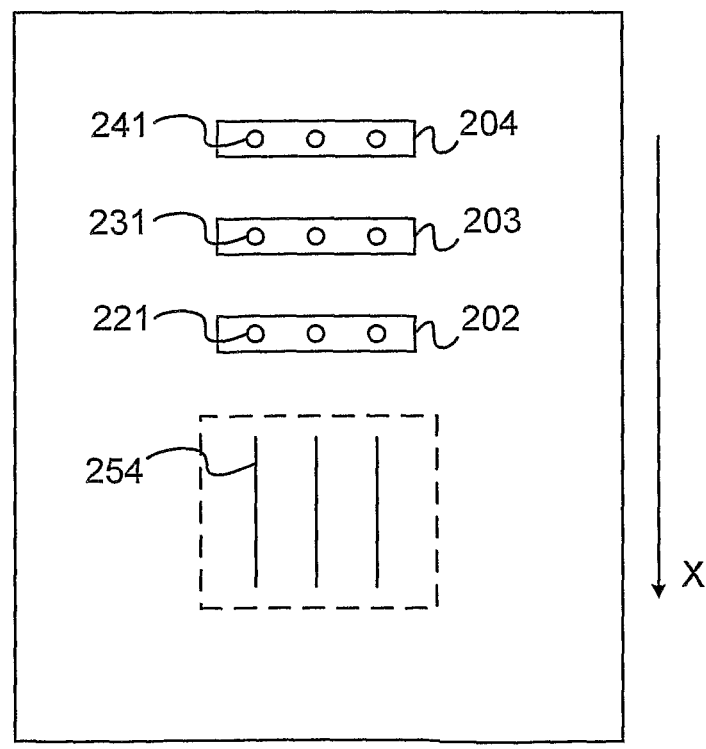

As shown in FIG. 2A, the printing units, for example units 202, 203, 204 may be arranged along the scan direction such that nozzles which are part of a single printing unit may print a corresponding line. For example, line 252 may be printed by printing unit 202 in three layers using a first nozzle 221 for the first layer, a second nozzle 222 for the second layer and a third nozzle 223 for the third layer. It will be appreciated that each printing unit may include hundreds of nozzles and the each layer of the line may be printed by more than one nozzle. According to other embodiments, as shown by FIG. 2B, units 202, 203, 204 may be arranged perpendicular to the scan direction. Accordingly, each nozzle group that is assigned to print a line in the scan direction includes nozzles from more that one printing unit. For example, line 254 may be printing in three layers where the first layer may be printed by nozzle 241 of printing unit 204, the second layer may be printed by nozzle 231 of printing unit 203 and the third layer may be printed by nozzle 221 of unit 204. Other printing arrangements are likewise applicable without departing from the scope of the invention.

Figure 3:
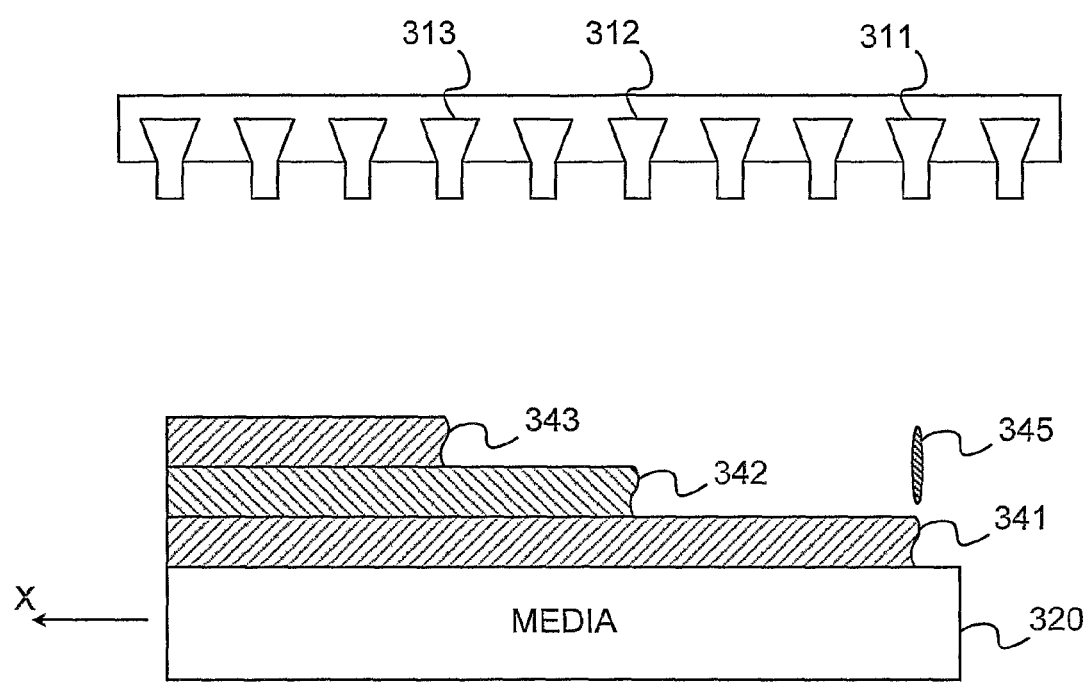
FIG. 3 is an exemplary illustration demonstrating a method of printing a line according to embodiments of the invention.

Reference is now made to FIG. 3 showing an illustration demonstrating a method of printing a line according to embodiments of the invention. A media 320 may be moved in a scan direction X. During a single scan, three layers may be formed using for example nozzles 311, 312 and 313. A first layer 341 may be deposited on media 320 by nozzle 311. For example, a droplet 345 may be dispensed by nozzle 311 to form part of layer 341. As will be appreciated by those skilled in the art, additional droplets deposited from nozzle 311 or from other nozzles may form a continuous line. Similarly, nozzle 312 may deposit a second layer 342 on layer 341 and nozzle 313 may deposit a third layer 343 on layer 342.

The time between deposition of material on a given location by nozzle 311 and deposition of material by nozzle 312 on the same spot or location may be determined to enable the first layer to dry. Such period of time may be controlled by the speed with which media 320 is being moved. For example, such speed may be controlled, e.g., by commands from controller 115 to conveyor 110, such that material deposited by nozzle 311 is substantially dry by the time it reaches a point where material is deposited by nozzle 312. Similarly, material deposited by nozzle 312 may be dry enough by the time it is positioned under nozzle 313 thus proper deposition of additional material by nozzle 313 may be enabled. According to some embodiments, the media on which material is deposited may be heated in order to expedite the drying or hardening of the deposited material so that subsequent layers may be deposited. Increased heating of the media surface may increase the rate of evaporating the liquid constituent of the deposited material and may reduce the amount of spread of the deposited material onto the surface. Further, the spacing or distance between nozzles may be configured to allow for a desired drying time, e.g., placing nozzles 311 and 312 further apart may allow for more drying time of material deposited by nozzle 311 before additional material is deposited by nozzle 312.

Figure 4:
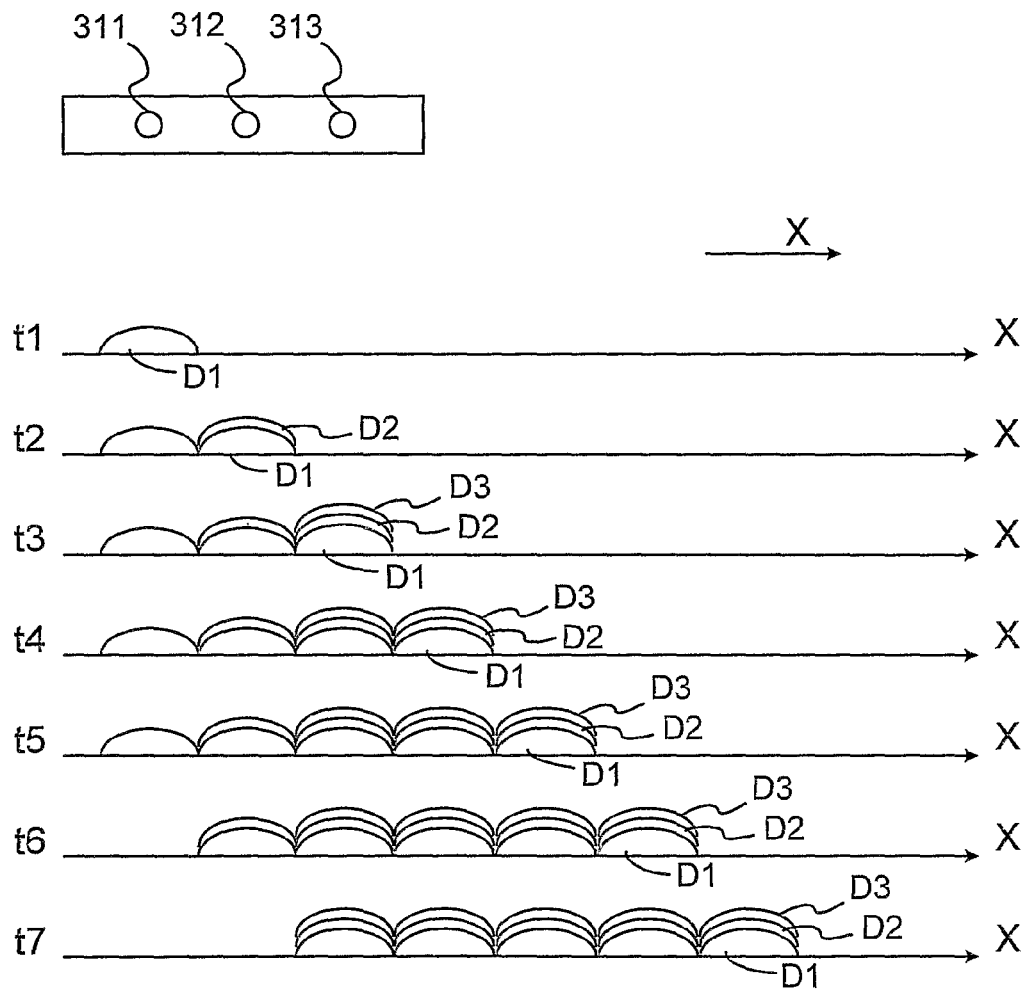
FIG. 4 shows a time line illustration demonstrating a method of printing a line according to exemplary embodiments of the invention.

Reference is further made to FIG. 4 showing an exemplary illustration demonstrating printing a line having three layers according to embodiments of the invention. The illustration shows a time line of the printing process starting at time $t_1$. At time $t_1$, a single droplet $D_1$ belonging to the first layer was deposited on a print media, such as media 320. At time $t_2$, after the media has advanced in the scan direction X, the first layer includes two droplets both dispended from nozzle 311 and further a second layer is being printing by depositing a droplet $D_2$ from nozzle 312 on droplet $D_1$. As detailed herein, prior to depositing droplet $D_2$ the material of droplet $D_1$ be solidified. According to some embodiments, the media on which material is deposited may be heated in order to expedite the drying or hardening of the deposited material so that subsequent layers may be deposited.

At time $t_3$, after the media has further advanced in the scan direction X, the first layer includes three droplets, all dispended from nozzle 311, the second layer includes two droplets dispensed from nozzle 312 and further a third layer is being printing by depositing a droplet $D_3$ from nozzle 313 on droplet $D_2$. The process may commence until time $t_7$, where droplet $D_4$ belonging to the third layer was deposited by nozzle 313 to form a line comprising three layers.

Referring back to the exemplary embodiment of manufacturing metallization patterns for photovoltaic cells, the silicon layer on which conductive line are printed may be coated with an anti-reflective coating of, for example, silicon nitride or titanium oxide. This coating layer may also be referred to as passivation layer. The deposited material may include an electrically conductive component, a surface penetrating component to penetrate the passivation layer at the top surface of the substrate and a binding component. For example, the deposited material may include silver particles as the electrically conductive component and small glass particles or glass fits that may assist the silver in penetrating through the anti-reflective coating.

The binding component may include additives such as lead, Bismuth, Antimony and others that may chemically react with the surface, for example with the silicon nitride, at high temperature of 500-900° C. The chemical reaction may provide good contact of the conductive material with the underlying silicon layer of the photovoltaic cell. According to embodiments of the invention, heating the substrate having the conductive lines printing thereon to a high temperature of above 500° C. may bind the conductive line to the substrate such that the line may become inseparable from the substrate.

According to embodiments of the invention, after printing a line, layer by layer, either by a single scan or alternatively by multi scans, the printed substrate is heated to a temperature of above 500° C. such that the printed line is bound to the surface of the substrate and becomes inseparable from the substrate. According to other embodiments, the surface may be heated to a temperature above 600° C. According to embodiments, the material of each layer is solidified prior to dispensing the successive layer using for example, photo curing of the material, cooling the temperature of the material below a phase change point or heating the material and evaporating volatile components from the material. In this context, the term solidified may also include obtaining a continuous line in which the metal particles are bound to each other. Heating to a temperature of above 500° C. or 600° C. may cause the glass frits to melt and penetrate the passivation layer so that the metallic particles within the deposited material may be bonded firmly to the underlying silicon substrate. Further, the heating may cause the metal particles to melt into each other and to form a nearly smooth solid metal line. As will be appreciated by those skilled in the art, even though the melting point of bulk silver, for example, is above 1000° C., nano silver particles may melt into each other below 500° C., depending on the particles" size.

According to some embodiments of the invention, the method of printing a line, layer by layer, either by a single scan or alternatively by multi scans, may include prior to dispensing a first material to fabricate the conductive line, depositing, on the substrate, a second material as barrier at areas adjacent to the area on which the line would be printed (at both sides of the line) so as to prevent the first material from spreading over the substrate. The barrier material may be waxed-based material and may be deposited also on the area on which the line would be printed. These embodiments may be utilized for printing conductive lines on a silicon wafer during manufacturing of solar cells.

According to other embodiments of the invention, the barrier material may be printed as a thin coating on the entire top surface of the wafer (substrate), prior to printing the conductive lines. The coating material may be a material that would serve as non-wetting material for the material of the conductive lines. Further, the coating material may be transparent to solar radiation or alternatively may evaporate or burn at temperature higher than 500 C° so as not to block sunlight during use of the solar cell. Such a coating layer may become transparent by coating with a thin layer that may include only a few molecules. Non-limiting example of a barrier coating material is a nearly monolayer of dimethyl siloxane or Silane derivatives.

Some embodiments of the present invention may be implemented in software for execution by a processor-based system. For example, embodiments of the invention may be implemented in code and may be stored on a storage medium having stored thereon instructions which can be used to program a system to perform the instructions. The storage medium may include, but is not limited to, any type of disk including floppy disks, optical disks, compact disk read-only memories (CD-ROMs), rewritable compact disk (CD-RW), and magneto-optical disks, semiconductor devices such as read-only memories (ROMs), random access memories (RAMs), such as a dynamic RAM (DRAM), erasable programmable read-only memories (EPROMs), flash memories, electrically erasable programmable read-only memories (EEPROMs), magnetic or optical cards, or any type of media suitable for storing electronic instructions, including programmable storage devices.

Such a system may include components such as, but not limited to, a plurality of central processing units (CPU) or any other suitable multi-purpose or specific processors or controllers, a plurality of input units, a plurality of output units, a plurality of memory units, and a plurality of storage units. Such system may additionally include other suitable hardware components and/or software components.

Embodiments of the invention may include an article such as a computer or processor readable medium, or a computer or processor storage medium, such as for example a memory, a disk drive, or a USB flash memory, encoding, including or storing instructions, e.g., computer-executable instructions, which when executed by a processor or controller, carry out methods disclosed herein.

Unless explicitly stated, the method embodiments described herein are not constrained to a particular order or sequence. Additionally, some of the described method embodiments or elements thereof can occur or be performed at the same point in time or overlapping points in time. As known in the art, an execution of an executable code segment such as a function, task, sub-task or program may be referred to as execution of the function, program or other component.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

The invention claimed is:

1. A method of printing lines, the method comprising:
depositing an electrically conductive material on a semiconductor wafer from a plurality of nozzles to form a multi-layered line of a desired cross section area or a desired height by dispensing the material in at least two layers in a single scan, wherein each layer is printed by different nozzles and the number of layers in the line is determined based on the desired cross section area or height.

2. The method of claim 1, wherein the cross section area is perpendicular to a length dimension of the line.

3. The method of claim 1, wherein the line is formed in a scan direction and the nozzles are arranged in the scan direction.

4. The method of claim 1, wherein the nozzles are arranged in groups and each of said groups forms one of said layers.

5. The method of claim 4, wherein the line is formed in a scan direction and the groups are arranged in the scan direction.

6. The method of claim 4, wherein each of said groups comprises one of said nozzles.

7. The method of claim 1 comprising:
heating at least a portion of the semiconductor wafer to enable solidification of each of the layers prior to dispensing a successive layer.

8. The method of claim 7, wherein the heating evaporates a volatile component from the material.

9. The method of claim 1, wherein within at least one of said layers of said line, droplets of said material partially overlap.

10. The method of claim 1, wherein the amount of overlap is predetermined so as to minimize a width dimension of the line.

11. The method of claim 1, wherein the nozzles are part of a single printing unit.

12. The method of claim 1 comprising:
printing a plurality of lines by a plurality of printing units, wherein each of the lines is printed with at least two layers in a single scan by a respective one of the printing units.

* * * * *